(12) United States Patent
Xu

(10) Patent No.: US 11,282,731 B2
(45) Date of Patent: *Mar. 22, 2022

(54) WAFER CUTTING DEVICE AND METHOD

(71) Applicant: JIANGSU LEUVEN INSTRUMMENTS CO. LTD, Jiangsu (CN)

(72) Inventor: Kaidong Xu, Leuven (BE)

(73) Assignee: JIANGSU LEUVEN INSTRUMENTS CO. LTD, Jiangsu (CN)

( * ) Notice: Subject to any disclaimer, the term of this patent is extended or adjusted under 35 U.S.C. 154(b) by 210 days.

This patent is subject to a terminal disclaimer.

(21) Appl. No.: 16/251,264

(22) Filed: Jan. 18, 2019

(65) Prior Publication Data

US 2019/0157126 A1  May 23, 2019

Related U.S. Application Data

(63) Continuation of application No. PCT/CN2017/084103, filed on May 12, 2017.

(30) Foreign Application Priority Data

Jul. 22, 2016 (CN) .......................... 201610587172.2

(51) Int. Cl.
*H01L 21/683* (2006.01)
*H01L 21/02* (2006.01)
(Continued)

(52) U.S. Cl.
CPC ...... *H01L 21/683* (2013.01); *H01L 21/02019* (2013.01); *H01L 21/304* (2013.01);
(Continued)

(58) Field of Classification Search
None
See application file for complete search history.

(56) References Cited

U.S. PATENT DOCUMENTS 6,095,899 A * 8/2000 Elmar ................. B28D 5/0076
451/28
8,361,234 B2 * 1/2013 Izuta ................. H01L 21/67051
118/730

(Continued)

FOREIGN PATENT DOCUMENTS

CN  101880878 A  11/2010
CN  104992915 A  10/2015
(Continued)

OTHER PUBLICATIONS

International Search Report for PCT Application No. PCT/CN2017/084103; State Intellectual Property Office of P.R. China; Beijing, China; dated Aug. 14, 2017.

(Continued)

*Primary Examiner* — Sylvia Macarthur
(74) *Attorney, Agent, or Firm* — Thomas E. Lees, LLC

(57) ABSTRACT

A wafer cutting device comprises an etching unit, including a wafer holding device and a fluid guide shroud; a gas supply unit; and a chemical reaction liquid supply unit. The wafer holding device includes a carrier disk, which is configured to fix a wafer for cutting and provided with gas apertures, and a gas passage disposed below the carrier disk. The fluid guide shroud is a double-layer structure including an inner layer, an outer layer and a hollow interlayer, located above the wafer holding device and has adjustable spacing with the wafer holding device, and regulates a flow direction of a chemical reaction liquid and protective gases. The gas supply unit supplies a protective gas to the inner layer of the shroud and supplies a protective gas to the carrier disk through the gas apertures. The chemical reaction liquid supply unit supplies the chemical reaction liquid to the interlayer.

4 Claims, 4 Drawing Sheets

(51) Int. Cl.
*H01L 21/67* (2006.01)
*H01L 21/304* (2006.01)
*H01L 21/306* (2006.01)

(52) U.S. Cl.
CPC .. *H01L 21/30604* (2013.01); *H01L 21/67028* (2013.01); *H01L 21/67075* (2013.01); *H01L 21/67092* (2013.01); *H01L 2221/683* (2013.01)

(56) References Cited

U.S. PATENT DOCUMENTS

| | | | | |
|---|---|---|---|---|
| 8,696,863 | B2* | 4/2014 | Higashijima | H01L 21/67034 156/345.55 |
| 2002/0000424 | A1* | 1/2002 | Hata | H01L 21/6708 216/83 |
| 2002/0025656 | A1 | 2/2002 | Arai et al. | |
| 2006/0021636 | A1* | 2/2006 | Miya | C03C 23/0075 134/33 |
| 2006/0088983 | A1 | 4/2006 | Fujisawa et al. | |
| 2006/0130967 | A1 | 6/2006 | Fujisawa et al. | |
| 2009/0229641 | A1* | 9/2009 | Yoshida | B08B 3/14 134/107 |
| 2013/0171831 | A1* | 7/2013 | Namba | H01L 21/30604 438/748 |
| 2019/0157126 | A1* | 5/2019 | Xu | H01L 21/67092 |
| 2019/0318943 | A1* | 10/2019 | Xu | H01L 21/304 |

FOREIGN PATENT DOCUMENTS

| | | | |
|---|---|---|---|
| CN | 106158709 A | | 11/2016 |
| EP | 478108 A1 | * | 4/1992 |
| KR | 100912837 B1 | | 8/2009 |

OTHER PUBLICATIONS

Written Opinion of the International Searching Authority for PCT Application No. PCT/CN2017/084103; State Intellectual Property Office of the P.R. China; Beijing, China; dated Aug. 14, 2017.

Translation of the International Search Report for PCT Application No. PCT/CN2017/084103; State Intellectual Property Office of the P.R. China; Beijing, China; dated Aug. 14, 2017.

Translation of the Written Opinion of the International Searching Authority for PCT Application No. PCT/CN2017/084103; State Intellectual Property Office of the P.R. China; Beijing, China; dated Aug. 14, 2017.

First Office Action for Chinese Patent Application No. 201610587172.2; State Intellectual Property Office of the P.R. China; Beijing, China; dated Jun. 4, 2018.

\* cited by examiner

WAFER CUTTING DEVICE AND METHOD

CROSS REFERENCE TO RELATED APPLICATIONS

This is a Continuation application of International Application Serial No. PCT/CN2017/084103, filed on May 12, 2017, which claims the benefit of Chinese Application No. 201610587172.2, filed on Jul. 22, 2016, the disclosures of which are hereby incorporated by reference.

BACKGROUND

The present disclosure relates to the field of semiconductors, and in particular to a wafer cutting device and method.

In the research and development of the modern semiconductor industry, especially in the laboratory stage, due to factors such as scientific research costs, there is often a situation that a preceding process needs to be performed on an device for large-sized (e.g. 300 mm) wafers, but a subsequent process needs to be done on an device for small-sized (e.g. 150 mm or smaller) wafers. For example, some of the most advanced processes use a deep UV lithography device for fine line lithography and use a most advanced industrial device for high-precision coating of complex components, which all need to be performed on a most advanced device designed for large-sized wafers. However, these most advanced processes are not compatible with small-sized wafers, making it difficult to perform these processes on small-sized wafers. Subsequent processes are often performed on an device for small-sized wafers and can meet requirements for device research and development. This requires cutting a large-sized wafer into a small-sized wafer, so that the small-sized wafer after cutting can be delivered to a corresponding device for a subsequent process to be conducted. That is, the small-sized wafer after cutting should be compatible with a corresponding device.

Wafer cutting methods currently available in the market are mainly mechanical cutting by a saw blade as well as laser cutting. Mechanical cutting is characterized by cutting a wafer into rectangular or square samples according to a direction of its unique lattice. In addition, a laser-assisted technology can be used for wafer cutting, which is called stealth-cutting technology. However, this technique can only cut rectangular or square samples according to the unique lattice direction of the wafer. Wafer cutting of other shapes can be achieved only by complete laser cutting. However, complete laser cutting is time-consuming and costly, and there is no commercially available and established laser cutting equipment that can cut large wafers into small wafers.

BRIEF SUMMARY

In order to solve the above problems, the present disclosure provides a wafer cutting device, comprising an etching unit, a gas supply unit, and a chemical reaction liquid supply unit. The etching unit includes a wafer holding device and a fluid guide shroud. The wafer holding device includes a carrier disk and a gas passage. The carrier disk is configured to fix a wafer to be cut and is provided with a plurality of gas apertures. The gas passage is disposed below the carrier disk. The fluid guide shroud is a double-layer structure consisting of an inner layer, an outer layer and a hollow interlayer, located above the wafer holding device and has adjustable spacing with the wafer holding device, and used for regulating a flow direction of the chemical reaction liquid and a protective gas. The gas supply unit is connected to the fluid guide shroud and supplies a protective gas to the inner layer of the fluid guide shroud, and is connected to the gas passage for supplying a protective gas to the carrier disk through the gas apertures. The chemical reaction liquid supply unit is connected to the fluid guide shroud to supply the chemical reaction liquid to the interlayer of the double-layer structure.

Preferably, a lower edge of the fluid guide shroud has a circular shape.

Preferably, a size of the carrier disk is smaller than a size of the wafer to be cut.

Preferably, the gas apertures are arranged in a circular shape.

Preferably, the chemical reaction liquid supply unit includes a liquid storage tank, a recovery tank, and a pump, and the chemical reaction liquid is recycled by the following way: supplying a chemical reaction liquid to the interlayer of the fluid guide shroud by the pump; the chemical reaction liquid flowing through the wafer to be cut and then enters the recovery tank; after that, the chemical reaction liquid being returned to the liquid storage tank by the pump.

Embodiments of the present invention also provides a wafer cutting method using a wafer cutting device comprising an etching unit, a gas supply unit, and a chemical reaction liquid supply unit, the method comprising the steps of: a loading step of fixing a wafer to be cut on a carrier disk; an adjusting step of adjusting a distance between a fluid guide shroud and a carrier disk; and a gas supply step of supplying a protective gas to an inner layer of the fluid guide shroud by the gas supply unit to maintain an internal pressure of the fluid guide shroud greater than an external pressure, and supplying a protective gas to the carrier disk through a gas passage and gas apertures, so as to make the protective gas flow from the gas apertures to an edge of the wafer to be cut; an etching step of supplying a chemical reaction liquid to the interlayer of the fluid guide shroud by the chemical reaction liquid supply unit so as to make the chemical reaction liquid flow to a portion of the wafer to be cut which is outside a portion below the fluid guide shroud, and wet-etch the wafer to be cut to obtain a target wafer; a cleaning step of substituting the chemical reaction liquid in the chemical reaction liquid supply unit with ultrapure water and supplying it to the interlayer of the fluid guide shroud to remove the chemical reaction liquid remaining on a surface of the target wafer; a drying step of increasing a pressure and a flow rate of protective gas supplied to the inner layer of the fluid guide shroud to dry the target wafer; and a picking step of raising the fluid guide shroud to pick the target wafer from the carrier disk.

In the case that there are a plurality of target wafers, providing a plurality of fluid guide shrouds of the same number and sizes as the target wafers as well as a plurality of wafer holding devices of the same number as the target wafers.

Preferably, a distance between the fluid guide shroud and the carrier disk is 0.1 to 30 mm.

Preferably, the protective gas is an inert gas, and the protective gas supplied to the carrier disk and the protective gas supplied to the inner layer of the fluid guide shroud are the same or different inert gases.

Preferably, in the loading step, the wafer to be cut is fixed to the carrier disk by vacuum adsorption; and in the picking step, the vacuum adsorption is released to remove the target wafer from the carrier disk.

DETAILED DESCRIPTION

Figure 1:
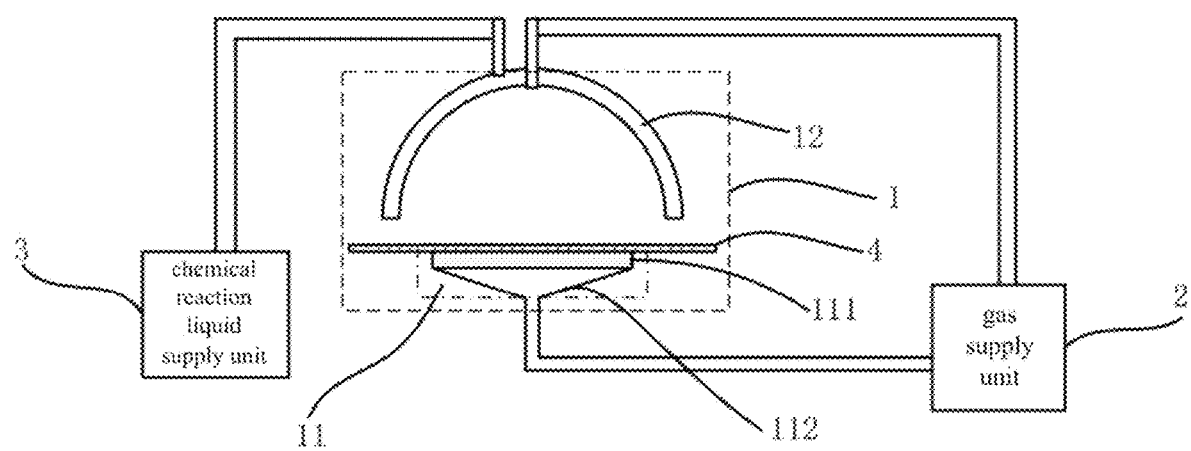
FIG. 1 is a schematic structural view of a wafer cutting device according to an embodiment of the invention.

In order to make the objects, the solutions and the advantages of the invention more clear and distinct, the technical solutions in the embodiments of the present invention will be clearly and completely described in the following with reference to the accompanying drawings in the embodiments of the present invention. It should be appreciated that the specific embodiments are only intended to illustrate the invention and are not intended to limit the invention. The described embodiments are only a part of the embodiments of the invention, and not all of the embodiments. All other embodiments obtained by those skilled in the art based on the embodiments of the present invention without creative efforts are within the scope of the present invention.

In the description of the present invention, it is to be understood that the terms "upper", "lower" and the like refer to orientational or positional relationship based on that shown in the drawings, and are only for a convenient and simplified description of the present invention, rather than indicating or implying that a device or component must have a certain orientation or configured and operated in a certain orientation. Therefore, these terms should not be interpreted as liming the invention.

Further, the present invention provides examples of various processes and materials, but the invention may be practiced without these specific details, as will be understood by those skilled in the art. Unless otherwise indicated below, portions of the device can be implemented using processes and materials well known in the art.

As shown in FIG. 1, a wafer cutting device includes an etching unit 1, a gas supply unit 2, and a chemical reaction liquid supply unit 3. The specific structure of each unit is will be described below.

The etching unit 1 includes a wafer holding device 11 and a fluid guide shroud 12. The wafer holding device 11 includes a carrier disk 111 and a gas passage 112. The carrier disk 111 is used to fix the wafer 4 to be cut, and the carrier disk 111 is formed with a plurality of gas apertures 1111 (shown in FIG. 2). The gas passage 112 is provided below the carrier disk 111. The fluid guide shroud 12 has a two-layer structure, including an inner layer and an outer layer, and a hollow interlayer is formed between the inner layer and the outer layer. The fluid guide shroud is disposed above the wafer holding device 11 and a spacing therebetween is adjustable for regulating a flow direction of a chemical reaction liquid and a protective gas.

The gas supply unit 2 is connected to the gas passage 112 and supplies a protective gas to the carrier disk 111 through the gas apertures 1111. Also, the gas supply unit 2 is connected to the fluid guide shroud 12 and supplies a protective gas to the inner layer of the fluid guide shroud 12.

The chemical reaction liquid supply unit 3 is connected to the fluid guide shroud 12, and supplies a chemical reaction liquid to the interlayer of the two-layer structure.

In some embodiments, preferably, the fluid guide shroud 12 has a hemispherical shape. Of course, the fluid guide shroud may also be a two-layer structure of other shape, such as a conical shape, a cylindrical shape, and the like, with a lower edge thereof being circular. Furthermore, the fluid guide shroud may be a double-layer structure of any shape as long as the shape of the lower edge thereof conforms to the shape and size of a desired target wafer.

Preferably, a distance between the fluid guide shroud 12 and the wafer holding device 11 is 0.1 to 30 mm.

The protective gas is may be an inert gas, such as nitrogen, argon or the like. The protective gas supplied to the carrier disk and the protective gas supplied to the inner layer of the fluid guide shroud may be the same or different inert gases. For example, the carrier disk is supplied with nitrogen, the inner layer of the fluid guide shroud is supplied with argon, or both are supplied with nitrogen.

Figure 2:
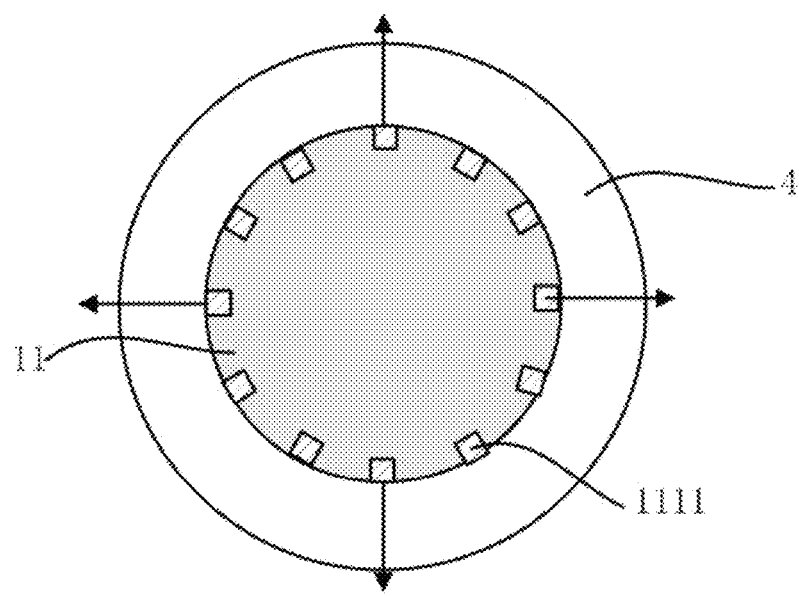
FIG. 2 is a schematic view illustrating an arrangement of gas apertures in the carrier disk.

The plurality of gas apertures 1111 in the carrier disk 111 may be arranged in a circular shape, as shown in FIG. 2. FIG. 2 schematically shows a flow direction of the protective gas, i.e., from the gas apertures 1111 to an edge of a lower surface of the wafer 4 to be cut.

Figure 3:
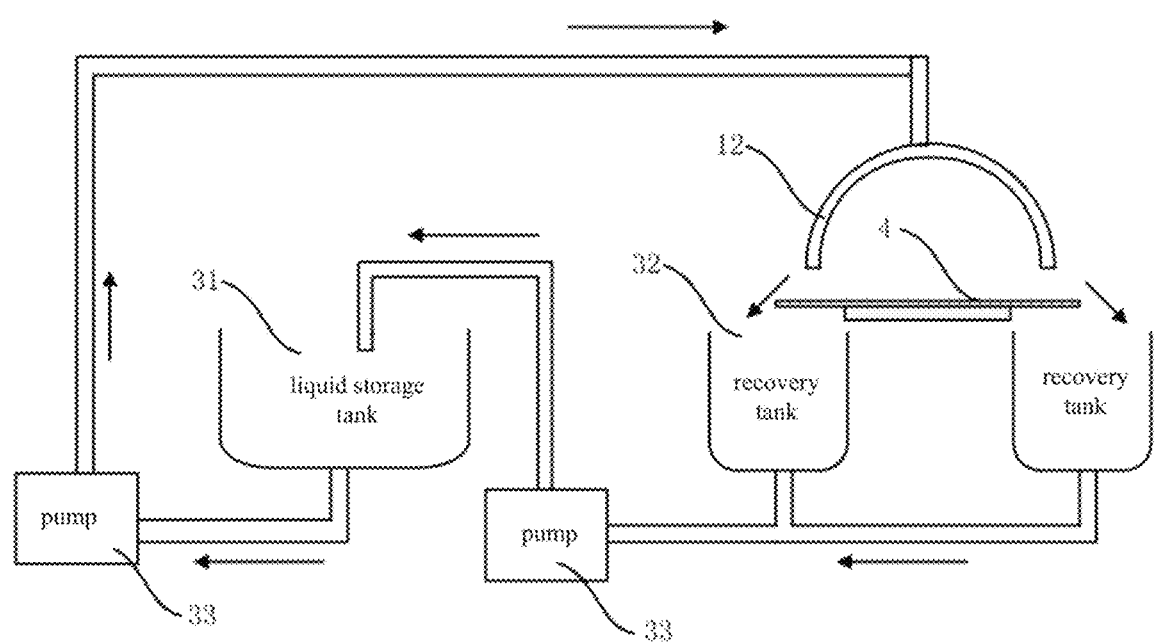
FIG. 3 is a schematic structural view showing a chemical reaction liquid supply unit in a wafer cutting device.

FIG. 3 shows a schematic structural view of the chemical reaction liquid supply unit 3. The chemical reaction liquid supply unit 3 includes a liquid storage tank 31, a recovery tank 32, and a pump 33. The chemical reaction liquid is recycled by the following way. Firstly, a chemical reaction liquid is supplied from the liquid storage tank 31 to the interlayer of the fluid guide shroud 12 through the pump 33; after that, the chemical reaction liquid flows to the wafer 4 to be cut and then enters the recovery tank 32; finally, the chemical reaction liquid is returned to the liquid storage tank 31 through the pump 33. A flow direction of the chemical reaction liquid is indicated by the arrows in FIG. 3.

Figure 4:
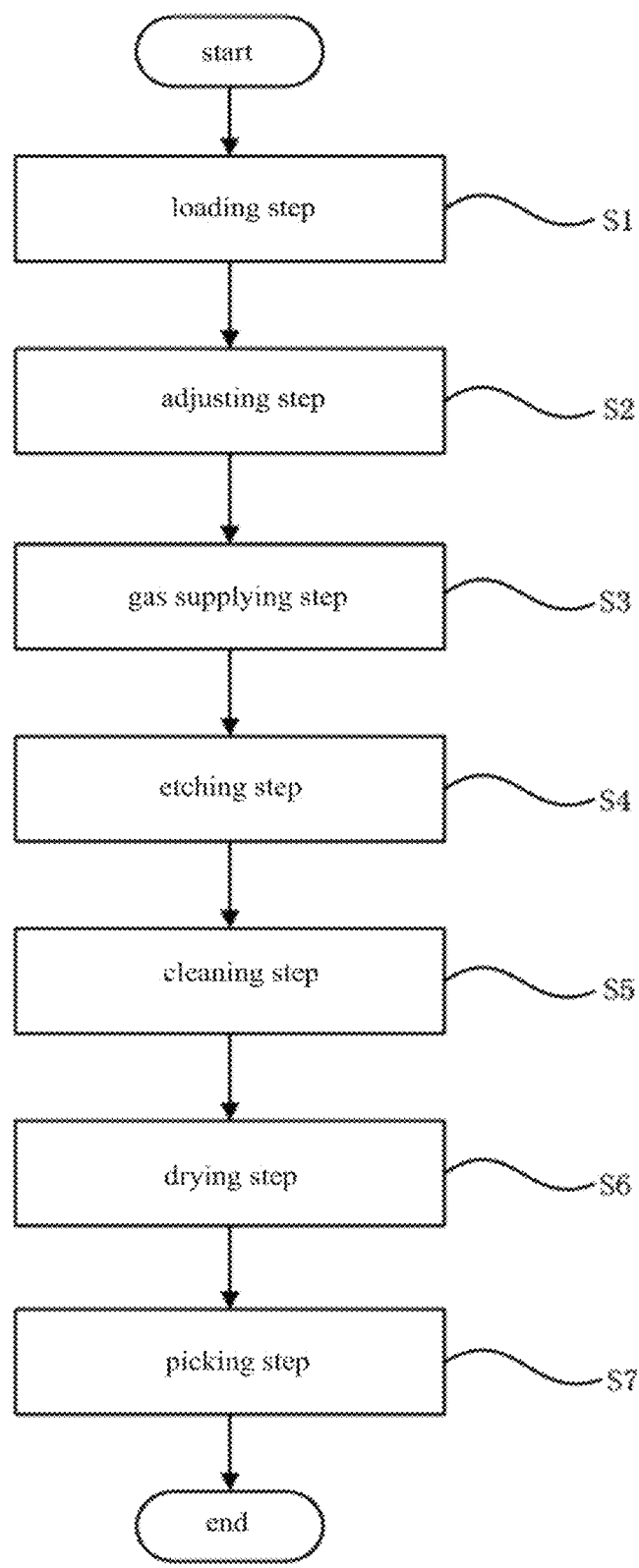
FIG. 4 is a flow chart of a wafer cutting method according to an embodiment of the invention.

Embodiments of the invention also provide a wafer cutting method, as shown in FIG. 4, comprising steps as below.

A loading step S1: the wafer 4 to be cut is fixed on the carrier disk 111. For example, the fixation can be made by vacuum adsorption. Preferably, a size of the carrier disk 111 is smaller than a size of the wafer 4 to be cut.

An adjusting step S2: a distance between the fluid guide shroud 12 and the carrier disk 111 is adjusted to a desired distance for the process; preferably the distance is 0.1 to 30 mm.

A gas supply step S3: firstly, a protective gas is supplied from the gas supply unit 2 to the inner layer of the fluid guide shroud 12, and a pressure inside the fluid guide shroud 12 is maintained to be larger than an external pressure, which is usually one standard atmospheric pressure; then, a protective gas is supplied from the gas supply unit 2 through the gas passage 112 and the gas apertures 1111 to the carrier disk 111 so that the protective gas flows from the gas apertures 1111 to an edge of the wafer 4 to be cut. The protective gas is an inert gas such as nitrogen, argon or the like. The protective gas supplied to the carrier disk 111 and the protective gas supplied to the inner layer of the fluid guide shroud 12 may be the same or different inert gases. For example, nitrogen may be supplied to the carrier disk 111, and argon gas may be supplied to the inner layer of the fluid guide shroud 12; or nitrogen may be supplied to both the carrier disk 111 and the inner layer of the fluid guide shroud 12.

An etching step S4: a chemical reaction liquid is supplied to the interlayer of the fluid guide shroud 12 so that the chemical reaction liquid flows to a portion of the wafer 4 to be cut, which is outside a portion of the wafer to be cut right under the fluid guide shroud 12; a wet-etching is performed on the wafer 4 to be cut to remove the portion of the wafer, which is located outside the portion of the wafer under the fluid guide shroud 12, so as to obtain a target wafer. During the entire etching process, the chemical reaction liquid is always flowing. Due to the effect of the supplied protective gas inside the inner layer of the fluid guide shroud 12, all the chemical reaction liquids are slowly blown toward the edge of the wafer 4 to be cut by the protective gas, so the portion of the wafer 4 to be cut that is located below the shroud 12 will not contact the chemical reaction liquid. In addition, due to the effect of the protective gas supplied to the carrier disk 111, a lower surface of the wafer 4 to be cut is always free of chemical reaction liquid and remains dry. After etching for a certain period of time, the portion of the wafer 4 to be cut outside the portion below the shroud 12 is completely etched away by the chemical reaction liquid, and a shape of a target wafer formed is exactly the same as a shape of the lower edge of the fluid guide shroud 12.

Figure 5:
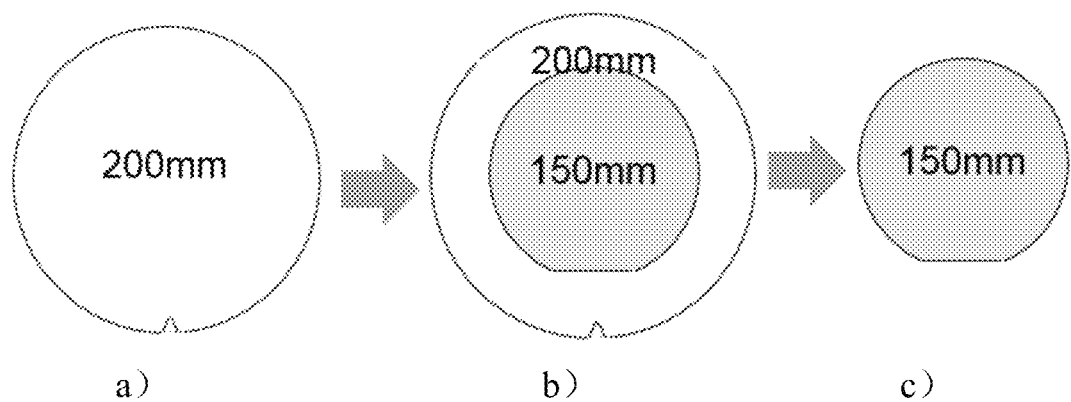
FIG. 5 is a schematic view of cutting a large wafer into a target wafer.

The shape and size of the fluid guide shroud are determined according to the size of the target wafer. In a specific example, as shown in FIG. 5, the wafer to be cut has a diameter of 200 mm and the target wafer has a circular shape of a diameter of 150 mm. Accordingly, a fluid guide shroud having a circular lower edge of a diameter of 150 mm can be selected. For example, a double-layer structure, such as a conical structure, a cylindrical structure or the like, which has a lower edge of a circular shape, can be selected. Preferably, the shroud has a hemispherical shape. Of course, the fluid guide shroud can also be a double-layer structure of any other shape as long as a shape of a lower edge thereof conforms to a desired shape and size of a target wafer.

Figure 6:
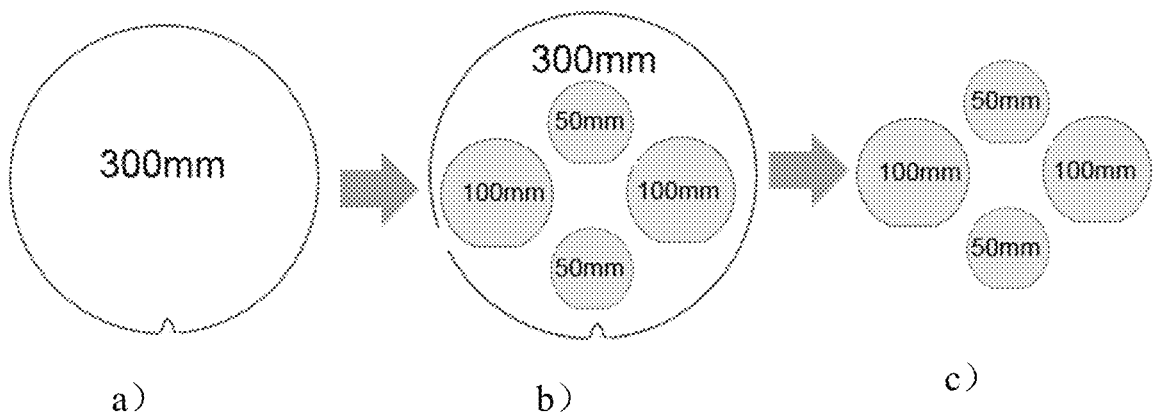
FIG. 6 is a schematic view of cutting a large wafer into a plurality of target wafers.

A large wafer can be tailored to one or more target wafers based on the size of the initial large wafer and the size of the target wafer. The size of the target wafer may be the same or different as desired, and its size and shape are controlled by the fluid guide shroud. As shown in FIG. 6, the large wafer to be cut has a diameter of 300 mm, and the target wafers include two small wafers having a diameter of 100 mm and two small wafers having a diameter of 50 mm. When a large wafer needs to be cut into a plurality of small wafers, if there are a plurality of target wafers, a plurality of same number of wafer holding devices and a plurality of fluid guide shrouds being the same numbers and sizes as the target wafers can be provided. In other embodiments, the size of the wafer to be cut, and the size, the number and the like of the target wafers are not limited to the above embodiments, which instead can be selected by those skilled in the art according to actual needs.

A cleaning step S5: the chemical reaction liquid in the chemical reaction liquid supply unit 3 is substituted with ultrapure water to be supplied to the interlayer of the fluid guide shroud 12 so as to remove the chemical reaction liquid remaining on a surface of the target wafer.

A drying step S6: increases a pressure and flow rate of the protective gas supplied to the inner layer of the fluid guide shroud 12 so as to dry the target wafer.

A picking step S7: the fluid guide shroud 12 is raised, and the target wafer is removed from the carrier disk 111. For example, the vacuum adsorption is released to remove the target wafer from the carrier disk 111.

According to the embodiments of the present invention, a large wafer can be cut into small wafers at a lower cost, which satisfies the needs of the semiconductor industry, in which some processes are necessary to be carried out on an advanced large-scale device, while other processes need to be carried out on a small-sized device. Therefore the present invention is advantageous for further reducing the cost of research and development.

The above is only specific embodiments of the present invention. The scope of the present invention is not limited thereto. It is intended that any modifications or substitutions occurred easily to those person skilled in the art based on the disclosure of the invention are all within the scope of the present invention.

What is claimed is:

1. A wafer cutting device, comprising:
an etching unit, a gas supply unit, and a chemical reaction liquid supply unit;
the etching unit includes a wafer holding device and a fluid guide shroud, wherein
the wafer holding device includes a carrier disk and a gas passage, the carrier disk being configured to fix a wafer to be cut and provided with a plurality of gas apertures, the gas passage being disposed below the carrier disk;
the fluid guide shroud is a double-layer structure, of a hemispherical, conical or cylindrical shape, consisting of an inner layer and an outer layer with one hollow interlayer therebetween, located above the wafer holding device and has adjustable spacing with the wafer holding device, and is used for regulating a flow direction of a chemical reaction liquid and a protective gas; and the fluid guide shroud has a lower edge of a circular shape, all extension lines of the lower edge are spaced from the carrier disk and extend vertically to a circumferential extension surface of the carrier disk, and a size or a shape of the lower edge of the fluid guide shroud are determined in consideration of matching a respective corresponding target wafer obtained by cutting the wafer to be cut;
the gas supply unit is connected to the fluid guide shroud so as to supply a protective gas to the inner layer of the fluid guide shroud, and is connected to the gas passage for supplying a protective gas to the carrier disk through the gas apertures; and
the chemical reaction liquid supply unit is connected to the fluid guide shroud to supply a chemical reaction liquid to the interlayer of the double-layer structure.

2. The wafer cutting device according to claim 1, wherein a size of the carrier disk is smaller than a size of the wafer to be cut.

3. The wafer cutting device according to claim 1, wherein the gas apertures are arranged in a circular shape.

4. The wafer cutting device according to claim 1, wherein the chemical reaction liquid supply unit includes a liquid storage tank, a recovery tank, and a pump, and the chemical reaction liquid is recycled by the following way:
supplying a chemical reaction liquid to the interlayer of the fluid guide shroud by the pump; the chemical reaction liquid flowing through the wafer to be cut and then entering the recovery tank; after that, the chemical reaction liquid being returned to the liquid storage tank by the pump.

* * * * *